United States Patent [19]
Gasworth

[11] Patent Number: 5,204,145
[45] Date of Patent: Apr. 20, 1993

[54] APPARATUS FOR PRODUCING DIAMONDS BY CHEMICAL VAPOR DEPOSITION AND ARTICLES PRODUCED THEREFROM

[75] Inventor: Steven M. Gasworth, Glenville, N.Y.

[73] Assignee: General Electric Company, Schenectady, N.Y.

[21] Appl. No.: 948,077

[22] Filed: Sep. 21, 1992

Related U.S. Application Data

[63] Continuation of Ser. No. 664,153, Mar. 4, 1991, abandoned.

[51] Int. Cl.$^5$ .............................................. C23C 16/48
[52] U.S. Cl. ................... 427/577; 118/723; 264/1.4; 264/81; 156/DIG. 68; 423/446
[58] Field of Search ............ 118/723; 427/34, 37, 427/577; 423/446; 156/DIG. 68; 264/1.4, 81

[56] References Cited

U.S. PATENT DOCUMENTS 4,987,002  1/1991  Sakamoto .......................... 427/249

FOREIGN PATENT DOCUMENTS

| | | | |
|---|---|---|---|
| 0286306 | 10/1988 | European Pat. Off. | |
| 3927136 | 2/1991 | Fed. Rep. of Germany | |
| 63-123895 | 5/1988 | Japan | 156/DIG. 68 |
| 63-123898 | 5/1988 | Japan | 156/DIG. 68 |
| 63-129098 | 6/1988 | Japan | 156/DIG. 68 |
| 2-155226 | 6/1990 | Japan | 156/DIG. 68 |
| 2219578 | 6/1989 | United Kingdom | |

OTHER PUBLICATIONS

Article–Japanese Journal of Applied Physics, vol. 27, No. 9, Sep. 1988 pp. L1600–L1602 –Rapid Growth of Diamond Films by Arc Discharge Plasma CVD –Akatsuka et al.

Article–Appl. Phys. Lett. 51 (10) Sep. 7, 1987 –Synthesis of Diamond Films in a rf Induction Thermal Plasma –Matsumoto et al. pp. 737–739.

Article–Rev. Sci. Instrum. 60(2), Feb. 1989 –Development of a New Microwave Plasma Torch and Its Application to Diamond Synthesis –Mitsuda et al. pp. 249–252.

Article –C&EN, May 15, 1989 –Emerging Technology of Diamond Thin Films –Bachmann et al. pp. 24–39.

*Primary Examiner*—Richard Bueker
*Attorney, Agent, or Firm*—William H. Pittman

[57] ABSTRACT

An improved method and apparatus are disclosed for producing large area diamond depositions. A mixture of a carbon compound such as methane, hydrogen and argon is introduced into a DC arc plasma torch to form a plasma jet. The plasma jet is directed and trapped into a partially enclosed chemical vapor deposition zone confined within a reaction chamber of a CVD process. The chemical vapor deposition zone is formed by walls wherein at least one such wall is a rotating substrate cooled to a set temperature. The plasma jet containing radicalized hydrogen and a carbon compound is impinged on the rotating substrate to produce large area diamond layer.

22 Claims, 2 Drawing Sheets

APPARATUS FOR PRODUCING DIAMONDS BY CHEMICAL VAPOR DEPOSITION AND ARTICLES PRODUCED THEREFROM

This application is a continuation of application Ser. No. 07/664,153 filed Nov. 4, 1991, now abandoned.

FIELD OF THE INVENTION

The present invention generally relates to improved apparatus and method used for producing diamonds by chemical vapor deposition and more particularly concerns an apparatus utilizing a jet producing plasma torch.

BACKGROUND OF THE INVENTION

Diamond is an allotrope of carbon exhibiting a crystallographic network comprising exclusively of covalently bonded, aliphatic $sp^3$ hybridized carbon atoms arranged tetrahedrally with a uniform distance of 1.545 Å between atoms. Diamond is extremely hard having a high Mohs hardness of 10. It exhibits four times the thermal conductivity of copper and it is electrically insulating. As a result it is an ideal heat sink or a circuit substrate for semiconductor devices.

Diamond can be grown as an equilibrium phase at high pressures or it can be grown under metastable conditions at low pressures. The present invention is directed to growing diamonds at low pressures from hydrocarbon gases in the presence of atomic hydrogen. Many methods have been disclosed for growing diamonds metastably and generally these methods differ from each other by the way in which atomic hydrogen, a key reactant, is generated and transported within the system.

One class of methods developed in recent years for producing diamonds comprises chemical vapor deposition (hereinafter sometimes "CVD") methods. For a general summary of various diamond deposition methods including CVD methods, reference is made to Chemical & Engineering News, 67(20), 24–39 (May 15, 1989), incorporated herein by reference. In the CVD methods, a mixture of hydrogen and a gaseous carbon compound such as methane is activated and contacted with a substrate to produce diamond film on the substrate. The hydrogen gas is dissociated into atomic hydrogen and then reacted with the carbon compound to form condensable carbon radicals including elemental carbon. The carbon radicals are then deposited on a substrate to form a diamond. Some of the CVD diamond coating methods, hereinafter referred to as "filament" methods, employ one or more resistance heating units including heated wires or filaments, typically at temperatures of at least 2000° C., to provide the high thermal activation temperatures necessary to bring about these conversions.

Various problems have been encountered in the filament methods of CVD diamond deposition. For example, it is difficult to create conditions under which the linear deposition rate of diamond is high enough to become commercially feasible for thick film applications. Numerous methods employing a horizontal configuration of the substrate(s) and helically wound filaments having been disclosed, but for the most part, the linear deposition rates afforded therefrom are relatively low.

The linear growth rate was improved by the use of a jet producing plasma torch that generates a plasma jet by means of a direct current (hereinafter "DC") arc, radio frequency (hereinafter "RF") energy or a microwave energy. The plasma jet produced by the plasma torch is hot enough to produce gases in their elemental form.

Even though the use of plasma jets improves diamond growth, the aforementioned plasma jet methods are still plagued by their low efficiency and their low substrate area coverage, i.e. the substrate coverage for a conventional DC arc plasma torch is about one square centimeter. However, most of the commercial applications utilizing a thick free-standing diamond film, call for large film areas of over about 10 square centimeters. Thus, for the plasma jet process to be of commercial interest such a process should be able to produce thick (for example about 200 micrometers) free-standing diamond films having significantly large areas while still maintaining high diamond deposition rates.

An attempt was made to address some of the aforementioned problems by using multiple plasma jets to cover larger areas of the substrate. However, it is difficult to achieve a diamond film of uniform thickness by using such a method. The problem of a lack of a uniform diamond film thickness was partially addressed by using closely spaced multiple plasma jets, separated at about 2 millimeters. However, the closely spaced plasma jets severely reduce the life of a DC arc torch anode and it is extremely difficult to balance the power and the gas feeds to various plasma torches.

Another approach was to scan the plasma jet, produced by the plasma torch, over a larger area of the substrate to produce large area, thick (free-standing) diamond films. However, due to temperature modulation produced by such a scan, the diamond film produced therefrom has a tendency to crack.

SUMMARY OF THE INVENTION

In accordance with the present invention, diamond articles are produced by an improved chemical vapor deposition apparatus comprising a closed reaction chamber having at least one throat and at least one exhaust means, the chamber having means to maintain the chamber at a desired pressure, a partially enclosed chemical vapor deposition zone formed by walls, the zone being confined within the chamber, and at least one of the walls of the zone being a substrate capable of rotation, drive means to rotate the substrate, cooling means to cool the substrate to a set temperature, at least one jet producing plasma torch connected to the throat of the chamber, the torch having its jet discharge end aligned to trap a jet produced by the torch within the zone, a gas feeding system for feeding gases into the plasma torch, and a nozzle means for introducing carbon compound into the zone near the throat of the chamber or through the gas feeding system of the torch.

Further in accordance with the present invention, diamond articles are produced by an improved chemical vapor deposition method comprising effecting an arc discharge while feeding hydrogen or a mixture of hydrogen and an inert gas between an anode and a cathode of a DC arc discharge plasma torch to produce a plasma jet within a closed reaction chamber maintained at a desired pressure, feeding a gaseous carbon compound into the jet, radicalizing hydrogen and the gaseous carbon compound in the plasma jet, directing the plasma jet to a partially enclosed chemical vapor deposition zone confined within the chamber, trapping the plasma jet into the zone formed by walls wherein at least one of the walls is a rotating substrate, cooling the substrate to a set temperature, quenching the plasma jet by allowing the jet to impinge on the cooled substrate to form diamond layer on the substrate, and separating the diamond layer from the substrate to form the article.

Other advantages of the invention will become apparent upon reading the following detailed description and appended claims, and upon the reference to the accompanying drawings.

BRIEF DESCRIPTION OF THE DRAWINGS

For a more complete understanding of this invention reference should now be had to the embodiments illustrated in greater detail in the accompanying drawings and described below by way of examples of the invention.

While the invention will be described in connection with the preferred embodiment, it will be understood that it is not intended to limit the invention to the embodiment. On the contrary, it is intended to cover all alternatives, modifications and equivalents as may be included within the spirit and scope of the invention as defined by the appended claims.

DETAILED DESCRIPTION OF THE INVENTION

In recent years, the synthesis of a diamond film in the vapor phase has been extensively researched. The details of the growth mechanism of the diamond in the vapor phase are not clear. However, it is reported that the excited species, such as atomic hydrogen, methyl radical and atomic carbon, play important roles in the growth mechanism of diamonds. These excited species are produced by several CVD methods, for example, hot-filament CVD, microwave plasma CVD, electron-assisted CVD, RF plasma CVD and DC arc plasma CVD. These CVD methods use hydrogen and carbon compounds such as methane as the reactant gases.

It has been observed that the linear growth rate of diamond film deposition is affected by an amount of atomic hydrogen produced during the CVD process. It is also noted that the filament CVD process operating at a filament temperature of about 2500°. produces significantly less atomic hydrogen then a plasma jet discharge of the plasma torch, operating at about 5000° C. However, as stated earlier, the aforementioned plasma jet CVD process is handicapped by the low substrate area it covers during diamond deposition. For comparison, the basic DC arc plasma CVD process (free jet impinging at normal incidence) yields the highest linear diamond growth rate (in excess of about 100 micrometers to about 500 micrometers per hour) over the smallest substrate area (about 1 square centimeter), microwave plasma jet CVD process yields the lowest diamond growth rate (about 30 micrometers per hour) over the largest substrate area (about 6 square centimeters), the RF plasma CVD method falls somewhere between the two aforementioned extremes, and the hot-filament CVD process typically yields a linear growth of more than about 1 micrometer per hour.

Figure 1:
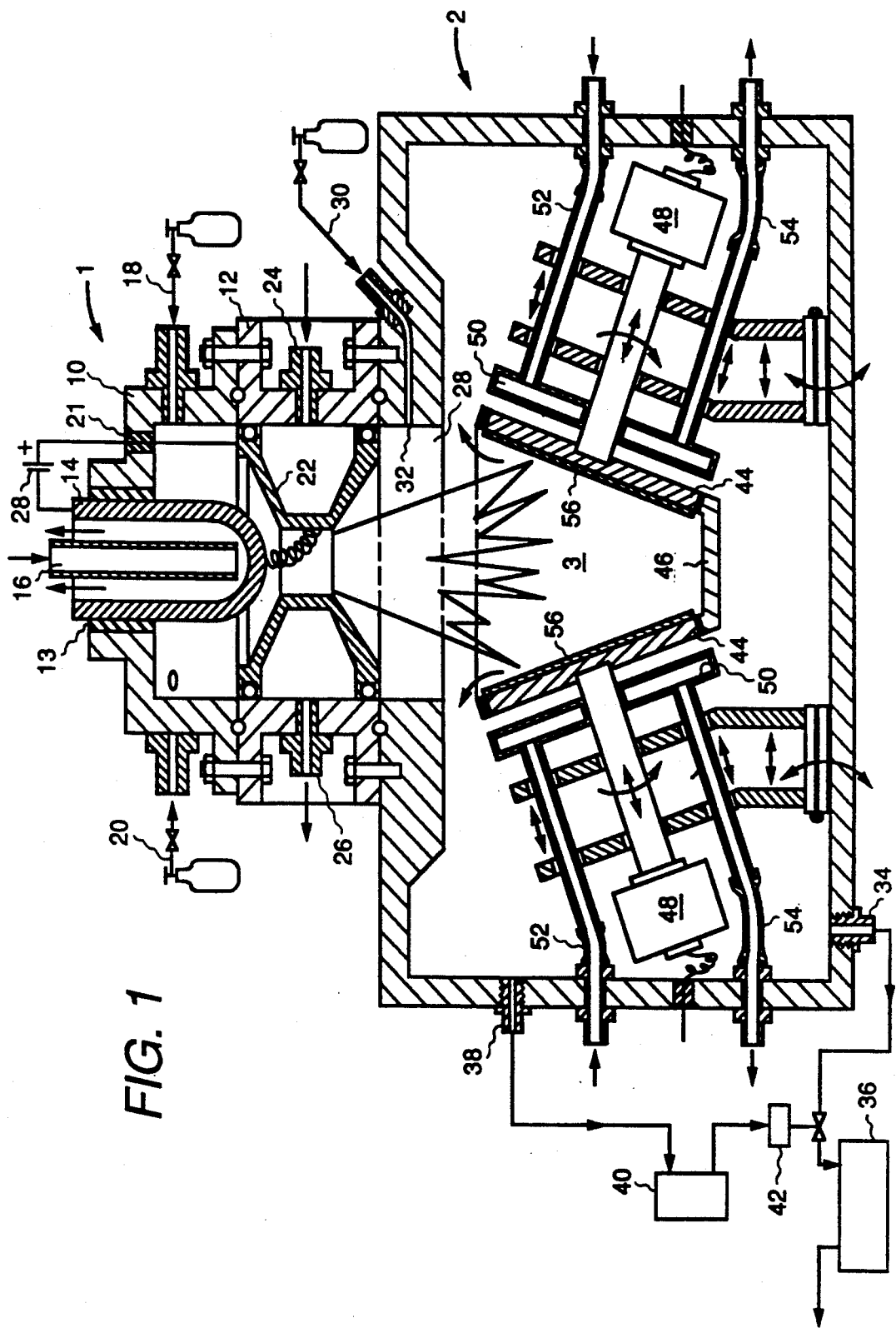
FIG. 1 is a cross-sectional view of the preferred embodiment of the invention.

The apparatus for carrying out the method of the present invention will be described with reference to accompanying drawings. Turning to FIG. 1 there is shown a diagrammatic view of the preferred embodiment of the apparatus for synthesizing diamond wherein a high temperature plasma jet is generated by a DC arc electric discharge. A plasma torch, preferably a DC arc plasma torch generally indicated by 1, is connected to a CVD reaction chamber generally indicated by 2. The torch comprises a cup-shaped upper flange 10 and a hollow cylindrically shaped lower flange 12, preferably cylindrical in shape. An elongated, hollow cylindrical cathode 14 having one end closed is affixed to and centrally disposed on upper flange 10. A centrally disposed cathode water line 16 is provided for cooling cathode 14 during operation. A gas feeding system comprising a hydrogen line 18 and an inert gas line 20 is positioned tangentially along the skirt of upper flange 10 to radially introduce hydrogen and an inert gas within torch 1 for producing a rotating DC arc. However, to those skilled in the art, it would be obvious to use some other means of producing such an arc. Typically, the inert gas is helium or argon, preferably the latter of the two.

A pulley-shaped anode 22 comprises preferably two circular, tapered flanges grooved along their rims and spaced apart along their centers by a hollow cylindrical shape. Such a pulley shape of anode 22 provides for the passage a DC arc through the hollow center of anode 22 and for the passage of a coolant through a hollow shape disposed along an outer wall of anode 22. Anode 22 is positioned within cylindrically shaped lower flange 12. Two or more "O" rings placed within the grooves on the flanges of anode 22 provide a water tight seal for an introduction of the coolant such as water within a toroidal shaped pocket formed between an inner wall of lower flange 12 and the outer wall of anode 22. A coolant inlet 24 and a coolant outlet 26 are provided on the outer wall of lower flange 12 for supplying the coolant to anode 22 during operation. Cathode 14 and anode 22 are connected to an adjustable DC power supply 28 of suitable power. Typically cathode 14 is made from graphite or tungsten and anode 22 is made from copper. An insulator 13 and an insulator 21 electrically insulate cathode 14 and anode 22 respectively. Adjustment means are provided to cathode 14 for varying the power of the DC arc generated between cathode 14 and anode 22. It should be noted that it will be apparent to those skilled in the art to use some other shapes and designs of plasma torch 1 that substantially produce the desired result.

Upper flange 10 and lower flange 12 are preferably bolted together to form DC arc plasma torch 1, which is then fastened onto a reaction chamber generally indicated by numeral 2. A throat opening 28 provided on reaction chamber 2 is aligned and fastened to an opening on lower flange 12 of DC arc plasma torch 1. It should be noted that DC arc plasma torch 1 and reaction chamber 2 are preferably bolted to produce a hermetically sealed environment within reaction chamber 2. An inlet line 30 is provided for introducing a carbon compound, such as methane, carbon monoxide or carbon dioxide, and it is preferably positioned in throat 28 of reaction chamber 2. A nozzle means 32 in throat 28 of reaction chamber 2 is provided for injecting the carbon compound in a plume of the plasma jet produced by plasma torch 1. Alternatively the carbon compound may be also introduced through upper flange 10 of plasma torch 1.

The walls of reaction chamber 2 may be cooled by means of a coolant line spirally welded along its outer walls. At least one exhaust outlet 34 is provided for the reaction gases to exit. Preferably a vacuum pump system 36 is connected to exhaust outlet 34 for exhausting the reaction gases formed within reaction chamber 2. A pressure transducer 38, fastened to the wall of reaction chamber 2 and having its transducer face exposed to the pressure within reaction chamber 2, is connected to a pressure regulating monitor 40. A valve 42, such as a butterfly valve, located in the exhaust line, is operatively connected to monitor 40 for maintaining the pressure within reaction chamber 2 at a desired level. It should be apparent to those skilled in the art that alternative means for monitoring and maintaining the pressure within reaction chamber 2 could be also employed.

A partially enclosed chemical vapor deposition zone, generally indicated by numeral 3, and confined within reaction chamber 2 is positioned underneath throat opening 28 of reaction chamber 2. Zone 3, formed by walls, has at least one of its walls a substrate capable of rotation. Zone 3 is aligned within reaction chamber 2 to trap the plasma jet produced by plasma torch 1. The shape of zone 3 is based on the shape of the article to be produced by the CVD plasma process. Preferably, zone 3 has a cuneate shape, i.e. a wedge shape and it is formed by two pairs of opposing sides. The first pair of the opposing sides providing the cuneate shape is formed by two substantially planar, converging substrates 44. The second pair of opposing sides, forming the ends, is shaped by two stationary faces 46 bridged along their bottom edges. Substrates 44 may be formed from titanium, molybdenum, nickel, copper, tungsten, silicon carbide, silicon nitride, silicon aluminum oxynitride, boron nitride, alumina, tungsten carbide, diamond, sapphire, or silicon, preferred substrates 44 being those of molybdenum. The term "pair" as used herein, is defined to include substrates that may be of different sizes, shapes or materials or may have different surface characteristics.

Each substrate 44, connected through a driving shaft to driving means such as an electric motor 48, is provided rotation in either clockwise or anti-clockwise direction by motor 48. Means are provided to adjust the cuneate shape of zone 3 by either sliding the shaft forward or backward, by repositioning the entire driving means or by any other suitable means. Preferably the entire driving means is placed within reaction chamber 2. However, it is understood that the driving means may be placed outside reaction chamber 2. It is also contemplated that a single driving means may be provided through a gear train and flexible driving shafts to rotate both substrates 44. Preferably substrates 44 are rotated in opposite directions to improve mixing of the plasma jet within zone 3. To maintain each substrate 44, at a set temperature, a cooling plate 50 is provided. Each cooling plate 50 is connected to an inlet substrate coolant line 52 and an outlet substrate cooling line 54. The temperature of substrate 44 may be maintained by providing a slidable adjustment to each cooling plate 50 whereby cooling plate 50 may be brought closer or further from substrate 44 to maintain substrate 44 at a set temperature. It is understood that those skilled in the art may substitute some other means of maintaining the temperature of substrate 44 at a set temperature. It is contemplated that substrates 44 may be cooled by circulating the coolent directly through substrates 44. It should be noted that the spatial orientation of either reaction chamber 2 or plasma torch 1 is not critical to the operation of the present invention.

In operation, as shown in FIG. 1, a DC arc is produced by supplying DC power from a DC power source 28. Typical DC power supplied to plasma torch 1 is about 1 kiloWatt to about 1000 kiloWatts, preferably about 40 kiloWatts. A rotating DC arc is created along the cylindrical opening located at the center of anode 22. By rotating the DC arc along the cylindrical opening in anode 22, erosion and pitting of the surfaces of anode 22 are minimized. The plasma jet may be preferably created by initially supplying an inert gas such as argon from inert gas line 20. Once the plasma jet has stabilized, hydrogen from hydrogen line 18 is then introduced through upper flange 10 into the plasma jet. Typically a mixture of hydrogen and inert gas containing about 60% by volume of hydrogen and about 40% by volume of the inert gas is used. Usually a flow rate of the mixture introduced in plasma torch 1 is about 1 standard liter per minute to about 1000 standard liters per minute, preferably about 100 standard liters per minute. It is contemplated that the DC arc plasma jet, if so desired, may be produced without the inert gas.

As the temperature of the plasma jet is about 5000° C., a coolant such as water is supplied to cathode 14 and anode 22 through cathode coolant line 16 and anode coolant line 24. Such a cooling is necessary to prevent cathode 14 and anode 22 from melting by the high heat of the DC plasma jet. The plume of the plasma jet spews out into zone 3. The pressure in reaction chamber 2 is maintained at about 10 Torr to about 800 Torr, preferably at about 100 Torr. A carbon compound such as methane is then introduced into throat 28 of reaction chamber 2.

The active species, namely hydrogen and the carbon compound are heated and radicalized by the plasma jet, to form a composition that includes radicalized carbon compound and atomic hydrogen. Typically the volumetric ratio of hydrogen to the carbon compound introduced into plasma torch 1 is about 200 to about 50: about 1. When the plasma jet containing the radicalized species is quenched by impinging the jet against cooler substrate 44, a diamond film 56 is produced on substrate 44. When methane is used as the carbon compound, the following reaction is believed to take place,

$$CH_4 \xrightarrow[\text{Atomic Hydrogen}]{\text{Heat}+} \text{Diamond} + 2H_2$$

Typically the plasma jet of the present invention is partially trapped by zone 3. The rotation of substrates 44, preferably in the opposite direction to one another, appears to improve mixing efficiency of the active species and thereby appears to improve formation of a thin boundary layer having a uniform thickness, at the surface of substrates 44. Typically substrates 44 are continuously rotated at a radial speed sufficient to produce a uniformly thick boundary layer along the surfaces of substrate. Usually substrates 44 are rotated at about 50 rpm to about 50,000 rpm, preferably at about 5000 rpm. The temperature of substrates 44 is set at about 600° C. to about 1200° C., preferably 800° C.

Once diamond films of the desired thicknesses are formed on substrates 44, the process is discontinued and the substrates are allowed to cool. If so desired, diamond film 56 may be separated from substrate 44 by conventional means of separation, such as etching out of substrate 44. It should be noted that the present invention also contemplates producing diamond film articles still attached to the underlying substrate.

Figure 2:
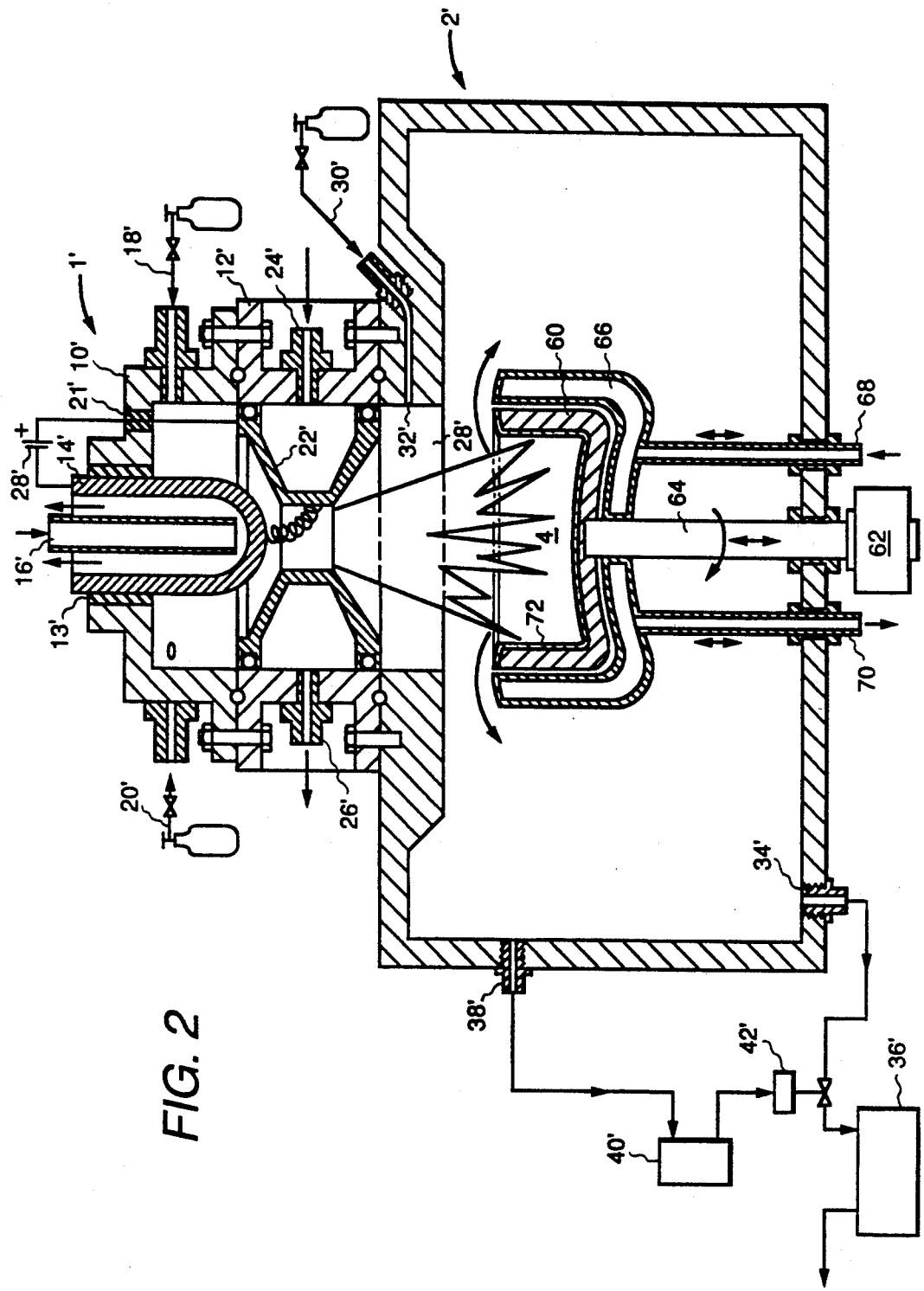
FIG. 2 is a cross-sectional view of another embodiment of the invention.

Turning now to FIG. 2, there is shown a diagrammatic view of another embodiment of the apparatus for synthesizing diamond by a high temperature plasma jet generated by a discharge from a DC electric arc discharge. As so far described the implement of FIG. 2 is substantially like that of FIG. 1. The two differ primarily in that FIG. 2 provides a different style of a chemical vapor deposition zone than in FIG. 1. All the components substantially common between FIG. 1 and FIG. 2 are represented by the same numerals, the sole exception being that they are supplemented with a prime.

A partially enclosed chemical vapor deposition zone, generally indicated by numeral 4, is confined within a reaction chamber 2'. A substrate 60 forming walls of zone 4 is provided a shape that closely follows the shape of a desired article formed by a diamond film. In this particular embodiment, for example, a cup shape is provided to substrate 60. A diamond article of such a shape may be used as a window or a dome (radome) of a missile that is transparent to infrared light. However, it should be noted that a substrate having other shapes and/or sizes may be also used to form zone 4. Substrate 60 is connected to a driving means, such as an electric motor 62, to rotate substrate 60 in clockwise or anticlockwise direction, by means of a shaft 64. The location of substrate 60 in relation to the plasma jet may be adjusted through an adjustment means provided to the driving means. By way of example, electric motor 62 is shown outside reaction chamber 2'. However, the entire driving means may be located inside reaction chamber 2'. Under either of the aforementioned circumstances, means for repositioning zone 4 should be provided to achieve optimal rates of diamond growth while covering maximal area of substrate 60.

To maintain substrate 60 at a set temperature a cooling plate 66, having a shape substantially resembling substrate 60, is provided to transfer heat through radiation and conduction. As shown in FIG. 2, cooling plate 66 has a size large enough to externally enclose substrate 60. Cooling plate 66 is connected to an inlet substrate coolant line 68 and and outlet substrate coolant line 70. A coolant, such as water, is supplied to cooling plate 66 through coolant lines 68 and 70. The temperature of substrate 60 may be maintained by providing a slidable adjustment to cooling plate 66, whereby cooling plate 66 may be brought closer to or further from substrate 60 thereby maintaining substrate 60 at a set temperature. It is understood that those skilled in the art may substitute some other means of maintaining temperature of substrate 60 at a set temperature.

In operation, DC arc is generated by means similar to those of the preferred embodiment, shown in FIG. 1. The plasma jet created by the DC arc and containing atomic hydrogen and a radicalized carbon compound is then quenched by impinging the jet against the cooled rotating substrate 60 to form a diamond film 72, which is then, if so desired, separated from substrate 60 by conventional means.

While particular embodiments of the invention have been shown, it will be understood, of course, that the invention is not limited thereto since modifications may be made by those skilled in the art, particularly in light of the foregoing teachings. It is, therefore, contemplated by the appended claims to cover any such modifications as incorporate those features which constitute the essential features of these improvements within the true spirit and scope of the invention.

What is claimed is:

1. Apparatus for producing diamond articles by chemical vapor deposition, comprising:
   a closed reaction chamber, formed by chamber walls and having at least one throat and at least one exhaust means, said chamber having means to maintain said chamber at a desired pressure;
   at least one jet producing plasma torch connected to said throat of said chamber;
   a chemical vapor deposition zone formed by zone walls separate from said chamber walls, said zone walls being confined within said chamber walls, and at least one of said walls of said zone being a substrate capable of rotation;
   said torch having its jet discharge end aligned to trap a jet produced by said torch within said zone, and said zone being enclosed on all sides except the side facing said torch;
   drive means to rotate said substrate;
   cooling means to cool said substrate to a set temperature;
   a gas feeding system for feeding gas into said plasma torch; and
   nozzle means for introducing a carbon compound into said zone near said throat of said chamber or through said gas feeding system of said torch.

2. The apparatus according to claim 1 wherein said plasma torch is a DC arc discharge plasma torch, a RF plasma torch or a microwave plasma torch.

3. The apparatus according to claim 1 wherein said substrate is titanium, molybdenum, nickel, copper, tungsten, silicon carbide, silicon nitride, silicon aluminum oxynitride, boron nitride, alumina, tungsten carbide, diamond, sapphire or silicon.

4. The apparatus according to claim 1 wherein said article is a heat sink or a circuit substrate for semiconductor devices.

5. The apparatus according to claim 1 wherein surfaces of said substrate are shaped to form said article.

6. Improved apparatus for producing diamond articles by chemical vapor deposition comprising:
   a closed reaction chamber having a throat and an exhaust means, said chamber having means to maintain said chamber at a desired pressure;
   a partially enclosed cuneate shaped chemical vapor deposition zone formed by two pairs of opposing sides, a first pair of opposing sides of said cuneate shape being substantially planar, converging substrates wherein each substrate is capable of rotation along an axis perpendicular to the plane of said substrate, a second pair of opposing sides being stationary faces;
   drive means to rotate each said substrate;
   cooling means to cool each said substrate to a set temperature;
   a DC arc plasma torch connected to said throat of said chamber, said torch having its jet discharge end aligned to trap a jet produced by said torch within said zone;
   a gas feeding system for feeding hydrogen or a mixture of hydrogen and argon into said plasma torch;
   a nozzle means to introduce a carbon compound into said zone near said throat of said chamber or through said gas feeding system of said torch.

7. The apparatus according to claim 6 wherein said drive means are capable of providing rotation of said substrates in opposite directions to improve mixing of said jet within said zone.

8. The apparatus according to claim 6 wherein said zone further comprises adjusting means to change shape of said cuneate shape of said zone.

9. The apparatus according to claim 6 wherein said substrate is titanium, nickel, copper, tungsten, silicon carbide, silicon nitride, silicon aluminum oxyintride, boron nitride, alumina, tungsten carbide, diamond, sapphire, silicon or molybdenum.

10. The apparatus according to claim 6 wherein said cooling means comprise a substantially planar cooling plate positioned in parallel and in adjustable relationship with each said substrate for transferring heat from said substrate to said cooling plate.

11. The apparatus according to claim 10 wherein said cooling means further comprise means for adjusting position of said heat exchanger to a position needed to attain said set temperature on said substrate.

12. The apparatus according to claim 6 wherein said article is a heat sink or a circuit substrate for semiconductor devices.

13. A method of producing diamond articles by chemical vapor deposition comprising:
    effecting an arc discharge while feeding hydrogen or a mixture of hydrogen and an inert gas between an anode and a cathode of a DC arc discharge plasma torch to a produce a plasma jet within a closed reaction chamber formed by chamber walls and maintained at a desired pressure;
    feeding a gaseous carbon compound into said jet;
    radicalizing hydrogen and said gaseous carbon compound in said plasma jet;
    directing said plasma jet to a partially enclosed chemical vapor deposition zone formed by zone walls that are separate from said chamber walls confined within said chamber;
    trapping said plasma jet into said zone formed by said zone walls wherein at least one of said zone walls is a rotating substrate;
    cooling said substrate to a set temperature;
    quenching said plasma jet by allowing said jet to impinge on said cooled substrate to form diamond layer on said substrate; and
    separating said diamond layer from said substrate to form said article.

14. The method according to claim 13 wherein said inert gas is helium or argon.

15. The apparatus according to claim 13 wherein said mixture is about 60% by volume of hydrogen and about 40% by volume of said inert gas.

16. The apparatus according to claim 13 wherein the ratio of hydrogen to carbon compound is about 50 to about 200: about 1.

17. The method according to claim 13 wherein said carbon compound is a hydrocarbon, carbon monoxide or carbon dioxide.

18. The method according to claim 17 wherein said hydrocarbon is methane.

19. The apparatus according to claim 13 wherein said desired pressure is about 100 Torr.

20. The method according to claim 13 wherein said set temperature of said substrate is about 800° C.

21. The method according to claim 13 wherein said substrate is continuously rotated at a radial speed sufficient to produce a boundary layer having a uniform thickness.

22. Apparatus for producing diamond articles by chemical vapor deposition, comprising:
    a closed reaction chamber formed by chamber walls and having at least one throat and at least one exhaust means, said chamber having means to maintain said chamber at a desired pressure;
    at least one jet producing plasma torch connected to said throat of said chamber;
    a chemical vapor deposition zone formed by zone walls separate from said chamber walls, and based on the shape of said diamond article, said zone walls being confined within said chamber walls, and at least one of said walls of said zone being a substrate capable of rotation;
    said torch having its jet discharge end aligned to trap a jet produced by said torch with in said zone, and said zone being enclosed on all sides except the side facing said torch;
    drive means to rotate said substrate;
    cooling means to cool said substrate to a set temperature;
    a gas feeding system for feeding gas into said plasma torch; and
    nozzle means for introducing carbon compound into said zone near said throat of said chamber or through said gas feeding system of said torch.

* * * * *